United States Patent [19]

Ganguillet et al.

[11] 4,307,181
[45] Dec. 22, 1981

[54] MASKING AGENT FOR THE DEPOSITION OF A MATERIAL AND METHOD FOR SUCH A DEPOSITION USING THIS MASKING AGENT

[75] Inventors: Claude Ganguillet, Neuchatel; Jacques Cognard, Chezard; Yves Ruedin, Saint-Blaise, all of Switzerland

[73] Assignee: Ebauches S.A., Neuchatel, Switzerland

[21] Appl. No.: 131,710

[22] Filed: Mar. 19, 1980

[30] Foreign Application Priority Data

Mar. 26, 1979 [CH] Switzerland ............... 2777/79

[51] Int. Cl.$^3$ ............................... G03C 5/00
[52] U.S. Cl. ................... 430/315; 430/324; 430/329
[58] Field of Search ............ 430/315, 324, 198, 270, 430/329; 427/91

[56] References Cited

U.S. PATENT DOCUMENTS

| | | | |
|---|---|---|---|
| 3,754,920 | 8/1973 | Kuchta | 96/87 R |
| 3,982,941 | 9/1976 | Inskip | 430/198 |
| 4,042,390 | 8/1977 | Steele | 430/198 X |

FOREIGN PATENT DOCUMENTS 1236250 6/1971 United Kingdom.

OTHER PUBLICATIONS

IBM Technical Disclosure Bulletin, vol. 15, No. 3, Aug. 1972, "Screenable Photoresist", Best et al.

*Primary Examiner*—Roland E. Martin, Jr.
*Attorney, Agent, or Firm*—Silverman, Cass & Singer, Ltd.

[57] ABSTRACT

To prepare a masking agent resistant to temperature, one adds silica powder to a photoresist. The mixture thus obtained is used to produce selective deposition of a layer of material on a substrate. The mixture of photoresist and silica powder serves as a photo-sensitive protective material which is then eliminated partially by selective exposure to light and use of a photographic developer. The temperatures involved in the deposition of the layer of desired material, for instance tin oxide, are about 500° C. (deposition in the vapor phase), and the photo-sensitive material would be liable to destruction if it did not contain silica powder. It is then necessary, once the deposition of the desired material has been effected, to increase the temperature of the workpiece up to about 540° C. to destroy and, hence, to eliminate the protective material.

9 Claims, 6 Drawing Figures

MASKING AGENT FOR THE DEPOSITION OF A MATERIAL AND METHOD FOR SUCH A DEPOSITION USING THIS MASKING AGENT

BACKGROUND OF THE INVENTION

This invention relates to a masking agent for the deposition of a material and to a method of deposition using this masking agent.

Photoresists are photosensitive materials having physio-chemical properties which change depending on whether or not they are exposed to light. They serve, especially, to protect substrates on which coating materials are to be deposited. They enable, by photo-chemical methods (destruction of the photoresists by exposure to light and by chemical means), the partial and selective protection of a substrate according to a desired pattern of the layer of the material to be deposited thereon, with a resolution which is higher than that achieved with other protective methods.

However, some techniques for the application of the coating layers, for instance application in the vapor phase, require the use of relatively high temperatures, higher than 300° C., which produce the destruction of the photoresists. Thus, the low resistance of the photoresists to such high temperatures constitutes a limitation of their use.

SUMMARY OF THE INVENTION

The purpose of the present invention is to overcome this limitation while furnishing a method for preparing a masking agent resistant to temperature, by the addition of silica powder to a photoresist. One can, especially, as a result of the present invention, use the excellent resolution of the photoresist protective agents in the manufacture of electro-optic passive display cells comprising glass plates on some areas of which is deposited an electrically conductive material, especially tin oxide, these areas providing electrodes for the activation of the constituent of the cell.

As a result of the present invention, one can use photoresists even if the coating of the conductive material is effected in the vapor phase, requiring the employment of temperatures which are higher than 500° C. During the heating, the photoresist is destroyed, but the grains of silica remain agglomerated, thus maintaining the initial definition.

It is to be noted that the material added to the photoresists, i.e. the silica powder, must not jeopardize the optical qualities of the mixture, that is to say its transparency, otherwise the light would not be able to act on and thus expose the whole thickness of the photoresist.

BRIEF DESCRIPTION OF THE DRAWING

Other features of the present invention will become fully apparent from the following detailed description of one mode of utilization of the invention, the appended claims and the accompanying drawings, in which:

DETAILED DESCRIPTION OF THE INVENTION

The plate of the cell as represented, designated by numeral 1, is made of glass and constitutes the substrate on which are deposited conductive tracks 2 of tin oxide ($SnO_2$).

The selective application of the tracks 2 on the plate 1 is effected by depositing first, on the whole surface of the plate, a layer 3 of a photoresist mixture and of silica powder ($SiO_2$) the particles of which have a diameter less than one micron. The photoresist, for instance, may be the product known in the trade under the name of AZ 1370 supplied by the firm HUNT (Great-Britain) and the silica powder may be the product known in the trade under the name of AEROSIL A 200 supplied by BASF (Germany). The AEROSIL content of the mixture is preferably from 1 to 2% by weight. The layer 3 has a thickness of 4 to 5 microns, for example.

Figure 2:
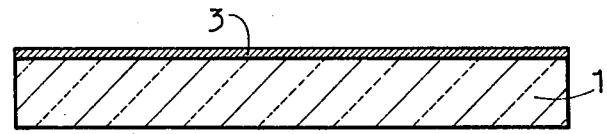
FIGS. 2 to 5 are sectional views of this plate represented in four different stages of its production.
Figure 3:
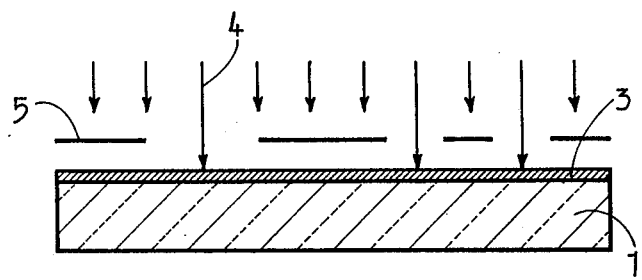
Figure 4:
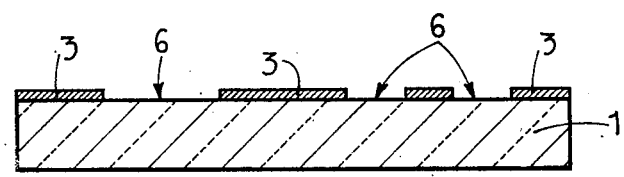

After this layer is applied (FIG. 2), it is submitted to illumination, indicated by arrows 4 of FIG. 3, through a masking screen 5. The areas of the mixture 3 of photoresist and silica which have been exposed to the light are eliminated by means of a photographic developer, in such a way that the plate 1 then has (FIG. 4) areas 6 free of the protective product alternating with areas covered by such a protective product.

Figure 5:
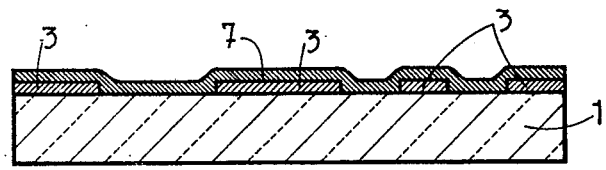

The next stage is the deposition, in the vapour phase, for example in a tunnel-oven, at a temperature of about 500° C., for a duration of 1 to 3 minutes depending on the desired deposition thickness of the coating, of a coating 7 of tin oxide ($SnO_2$) doped with antimony. The thickness will be of the order of about 1000 Å. As FIG. 5 shows, this layer of $SnO_2$ is applied on the protective layers 3 as well as on the areas 6 of the plate 1 which are not protected.

Figure 1:
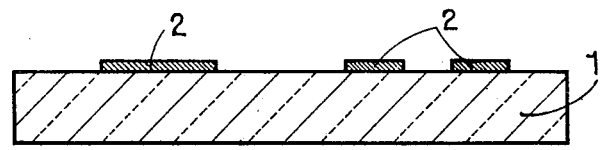
FIG. 1 is a sectional view of one of the plates of a passive electro-optic display cell.

The temperature at the output end of the tunnel-oven will be high, of the order of 540° C., and this completes the pyrolysis of the photoresist mixture 3 as a result of which this mixture is disaggregated. When the deposition is effected at 540° C. or above, this step is not necessary. It is then sufficient to effect ultrasonic cleaning so that the carbonized photoresist, as well as the AEROSIL with which it is mixed, in addition to the layer 7 of $SnO_2$ applied on the layer 3, disappear or is removed and there subsist only the conductive areas 2 (FIG. 1) constituted by the portions of the layer 7 which have not been eliminated.

Figure 6:
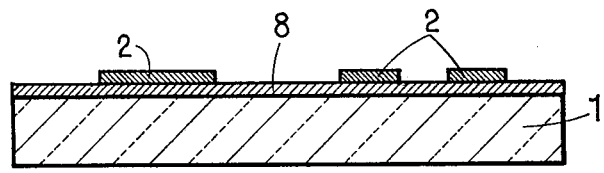
FIG. 6 is a sectional view of this plate illustrating a detail of its manufacture.

It is to be noted that, at the temperatures of deposition, that is to say about 540° C., the superficial layer of the glass of the plate 1 starts to soften so that the particles of AEROSIL would adhere to the plate if measures are not taken to avoid this happening. To this end, one covers the plate 1, before applying thereon the protective layer 3 made of the mixture of photoresist and of AEROSIL, with an under-layer 8 (FIG. 6) of silicon oxide the fusion temperature of which is higher than the temperature of deposition, so that the AEROSIL does not run the risk of adhering to the plate 1.

It is also to be noted that the present method can be applied to the deposition of materials other than tin oxide, for instance $In_2O_3$, and on substrates other than glass. As an example, alumina ($Al_2O_3$) may be deposited on ceramic or on sapphire, especially in the manufacture of capacitors.

We claim:

1. A method for depositing a layer of a material on at least one area of the surface of a substrate, said method comprising the steps of:
- providing a layer of a masking agent on the surface of said substrate except on said at least one area, said masking agent consisting of a mixture of photoresist and particles of silica powder, said providing a layer including exposing selected areas of the masking agent to light and eliminating the masking agent in said exposed areas by means of a developer,
- depositing a layer of said material over said surface including said at least one area, said deposition being provided at a temperature of at least 300° C.,
- heating said substrate to a temperature corresponding to the complete destruction of the photoresist mixed with said silica particles,
- cleaning the surface of said substrate so as to remove said particles, said destroyed photoresist and said material deposited thereon, so that said material only remains on said at least one area of said surface.

2. A method for depositing a layer of a material on at least one area of the surface of a substrate said deposition being provided at a temperature of at least 300° C., said method comprising the steps of:
- providing a layer of a masking agent on the surface of said substrate except on said at least one area, said masking agent consisting of a mixture of photoresist and particles of silica powder, said providing a layer including exposing selected areas of the masking agent to light and eliminating the masking agent in said exposed areas by means of a developer;
- depositing a layer of said material over said surface including said at least one area at a temperature which is sufficient to finally produce the complete destruction of the photoresist mixed with said silica particles, and
- cleaning the surface of said substrate so as to remove said particles, said destroyed photoresist and said material deposited thereon, so that said material only remains on said at least one area of said surface.

3. A method of depositing a layer of a material on at least one area of the surface of a substrate said deposition being performed at a temperature of at least 300° C., said temperature corresponding to the beginning of the softening of said substrate, said method comprising the steps of:
- depositing a layer of silica over the whole surface of said substrate,
- providing a layer of a masking agent on the surface of said substrate except on said at least one area, said masking agent consisting of a mixture of photoresist and particles of silica powder, said providing a layer including exposing selected areas of the masking agent to light and eliminating the masking agent in said exposed areas by means of a developer,
- depositing a layer of said material over said surface including said at least one area at a temperature which is sufficient to finally produce the complete destruction of the photoresist mixed with said silica particles, and
- cleaning the surface of said substrate so as to remove said particles, said destroyed photoresist and said material deposited thereon, so that said material only remains on said at least one area of said surface.

4. A method according to anyone of the claims 1, 2 or 3, wherein said material is deposited in vapor phase.

5. A method according to anyone of the claims 2 or 3, wherein said material is deposited in vapor phase at a temperature higher than 500° C.

6. A method according to claim 1, wherein the heating of the substrate is performed at a temperature of about 540° C.

7. A method according to anyone of the claims 1, 5 or 3, wherein said material is tin oxide.

8. A method as claimed in claims 1, 2 or 3 in which said particles have a diameter of less than one micron.

9. The method as claimed in claims 1, 2 or 3 in which the silica powder represents 1 to 2% of the weight of the mixture.

* * * * *